(12) United States Patent
Chiu et al.

(10) Patent No.: US 9,917,048 B2
(45) Date of Patent: Mar. 13, 2018

(54) INTERCONNECT STRUCTURE AND METHOD OF FORMING THE SAME

(71) Applicant: Taiwan Semiconductor Manufacturing Company, Ltd., Hsin-Chu (TW)

(72) Inventors: Chien-Chih Chiu, Xinying (TW); Ming-Chung Liang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/856,358

(22) Filed: Sep. 16, 2015

(65) Prior Publication Data

US 2016/0005689 A1 Jan. 7, 2016

Related U.S. Application Data

(63) Continuation of application No. 14/250,234, filed on Apr. 10, 2014, now Pat. No. 9,142,453.

(51) Int. Cl.
| | |
|---|---|
| *H01L 23/522* | (2006.01) |
| *H01L 21/768* | (2006.01) |
| *H01L 23/528* | (2006.01) |
| *H01L 23/532* | (2006.01) |
| *H01L 21/311* | (2006.01) |

(52) U.S. Cl.
CPC .... *H01L 23/5226* (2013.01); *H01L 21/76802* (2013.01); *H01L 21/76807* (2013.01); *H01L 21/76829* (2013.01); *H01L 21/76831* (2013.01); *H01L 21/76834* (2013.01); *H01L 21/76844* (2013.01); *H01L 21/76877* (2013.01); *H01L 23/528* (2013.01); *H01L 23/5329* (2013.01); *H01L 23/53204* (2013.01); *H01L 23/53295* (2013.01); *H01L 21/31144* (2013.01); *H01L 2924/0002* (2013.01)

(58) Field of Classification Search
CPC ........... H01L 23/5226; H01L 21/76802; H01L 21/76829; H01L 21/76831; H01L 21/76834; H01L 21/76844; H01L 21/76877; H01L 23/528; H01L 23/53204
USPC ........................................................ 257/774
See application file for complete search history.

(56) References Cited

U.S. PATENT DOCUMENTS

| | | | | |
|---|---|---|---|---|
| 5,512,785 A | * | 4/1996 | Haver ................... | H01L 23/485 257/587 |
| 6,156,664 A | | 12/2000 | Gau | |
| 7,884,014 B2 | * | 2/2011 | Jang ................. | H01L 21/76804 257/E21.578 |

* cited by examiner

*Primary Examiner* — Yasser A Abdelaziez
(74) *Attorney, Agent, or Firm* — Slater Matsil, LLP

(57) ABSTRACT

An interconnect structure and a method of forming an interconnect structure are disclosed. The interconnect structure includes a low-k (LK) dielectric layer over a substrate; a first conductive feature in the LK dielectric layer, wherein the first conductive feature has a first sidewall, a second sidewall facing the first sidewall, and a first bottom surface contacting the LK dielectric layer; a first dielectric feature along an upper portion of the first sidewall, wherein a length of the first dielectric feature is at least 10 percent less than a length of the first sidewall; and a second dielectric feature along an upper portion of the second sidewall. The interconnect structure may also include a second conductive feature adjacent to the first conductive feature in the LK dielectric layer.

19 Claims, 5 Drawing Sheets

INTERCONNECT STRUCTURE AND METHOD OF FORMING THE SAME

PRIORITY CLAIM

This application claims priority to as a continuation of U.S. patent application Ser. No. 14/250,234 filed on Apr. 10, 2014 and entitled "Interconnect Structure and Method of Forming the Same," which application is incorporated herein by reference.

BACKGROUND

The fabrication of integrated chips can be broadly separated into two main sections, front-end-of-the-line (FEOL) fabrication and back-end-of-the-line (BEOL) fabrication. FEOL fabrication includes the formation of devices (e.g., transistors, capacitors, resistors, etc.) within a semiconductor substrate. BEOL fabrication includes the formation of one or more metal interconnect layers comprised within one or more insulating dielectric layers disposed above the semiconductor substrate. The metal interconnect layers of the BEOL electrically connect individual devices of the FEOL to external pins of an integrated chip.

As the size of a semiconductor device size decreases, low dielectric constant (LK) materials and extra-low k (ELK) materials that have dielectric constants less than that of silicon dioxide have begun to be implemented in some designs as insulating materials between interconnects. However, a layer comprising LK materials or ELK materials may be damaged by a patterning process such as an etch process if it takes a long time to form a desired pattern. Accordingly, a need has developed in the art for an improved method of forming an interconnect structure for an integrated chip.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
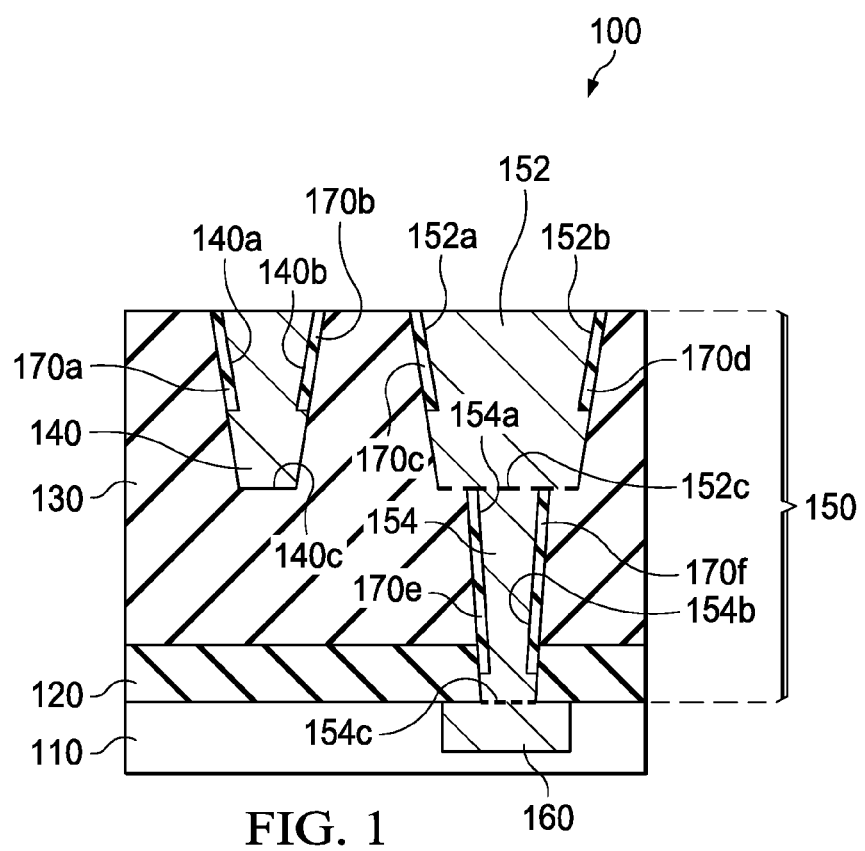
FIG. 1 is a cross-sectional view of an interconnect structure 100 according to various aspects of the present disclosure.

The present disclosure relates generally to semiconductor structures, and more particularly, to methods of forming an interconnect structure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "under", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter. It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

Figure 4:
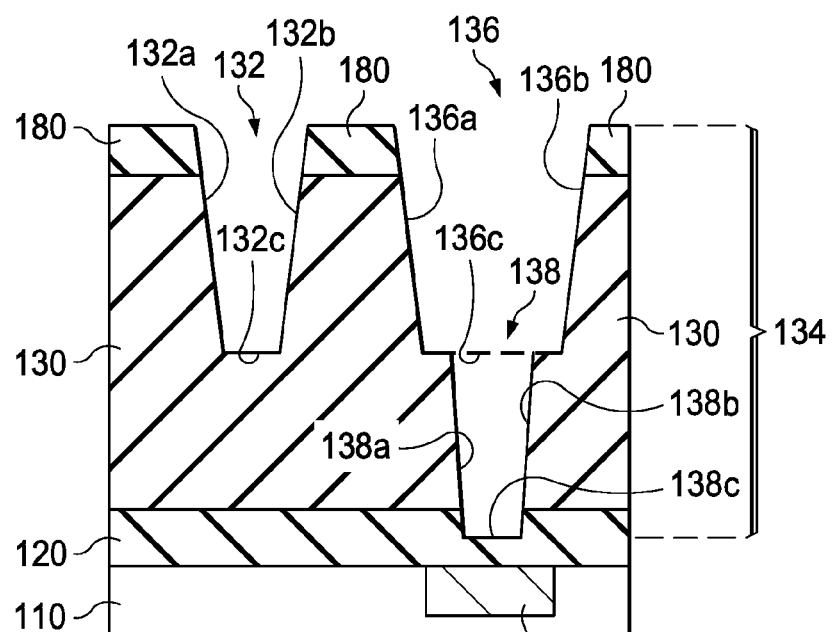

FIG. 1 is a cross-sectional view of an interconnect structure 100 according to various aspects of the present disclosure. As depicted in FIG. 1, the interconnect structure 100 comprises a low-k (LK) dielectric layer 130 over a substrate 110; a first conductive feature 140 in the LK dielectric layer 130, wherein the first conductive feature 140 has a first sidewall 140a, a second sidewall 140b facing the first sidewall 140a, and a first bottom surface 140c contacting the LK dielectric layer 130; a first dielectric feature 170a along an upper portion of the first sidewall 140a, wherein a length of the first dielectric feature 170a is at least 10 percent less than a length of the first sidewall 140a; and a second dielectric feature 170b along an upper portion of the second sidewall 140b. For ease of explanation, the features described herein are described as they appear in cross-section view. In an actual device, however, the features are three-dimensional structures. So, for instance, even though first conductive feature is illustrated and described herein as having a "first sidewall" and a "second sidewall," (as it is illustrated in the figures), in an actual device a first conductive feature will in reality have a single continuous sidewall that is continuous across its entire periphery. Stated another way, first sidewall 140a and second sidewall 140b are just two different portions of a single outer periphery of the first conductive feature 140. Likewise, when an opening, such as opening 132 described with reference to FIG. 4 is described as having a first sidewall 132a and a second sidewall 132b, one skilled in the art will recognize that these features are simply different portions of a single continuous sidewall defining the periphery of opening 132. The interconnect structure 100 may further comprise a second conductive feature 150 adjacent to the first conductive feature 140 in the LK dielectric layer 130. The interconnect structure 100 may further comprise a third conductive feature 160 connected to the second conductive feature 150. The interconnect structure 100 may further comprise an etch stop layer (ESL) 120 between the LK dielectric layer 130 and the substrate 110.

The substrate 110 may be a semiconductor substrate that includes an elementary semiconductor including silicon and/or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the substrate 110 may be a semiconductor on insulator (SOI). In some examples, the substrate 110 may include a doped epi layer. In other examples, the substrate 110 may include a multilayer compound semiconductor structure. Alternatively, the substrate 110 may include a non-semiconductor material, such as a glass, fused quartz, or calcium fluoride. In some embodiments, the substrate 110 includes a dielectric layer. In some embodiments, the substrate 110 includes a gate electrode or a metal line.

A dielectric material of the LK dielectric layer 130 comprises an oxide, SiO2, SiOCH, borophosphosilicate glass (BPSG), TEOS, spin-on glass (SOG), undoped silicate glass (USG), fluorinated silicate glass (FSG), high-density plasma (HDP) oxide, plasma-enhanced TEOS (PETEOS), fluorine-doped silicon oxide, carbon-doped silicon oxide, porous silicon oxide, porous carbon-doped silicon oxide, organic polymers, or silicone based polymers. The dielectric material is associated with a dielectric constant (k) less than 3.9. In some embodiments, k is between about 1.5 and about 2.8. The LK dielectric layer 130 may be formed by atomic layer deposition (ALD), chemical vapor deposition (CVD), physical vapor deposition (PVD), or combinations thereof.

The first conductive feature 140, the second conductive feature 150, or the third conductive feature 160 comprises Cu, Al, Ag, Au, or alloys thereof. The first conductive feature 140, the second conductive feature 150, or the third conductive feature 160 may comprise one or more barrier layers selected from a group of W, WN, Ti, Al, TiAl, TiN, TiAlN, Ta, TaC, TaN, TaCN, TaSiN, Mn, Zr, Nb, or Ru. The first conductive feature 140, the second conductive feature 150, or the third conductive feature 160 may also comprise one or more cap layers having a composition of the formula $M_xO_yN_z$, where M is a metal, O is oxygen, and N is nitrogen. Generally, the metal is selected from the group consisting of Al, Mn, Co, Ti, Ta, W, Ni, Sn, Mg, or combinations thereof. The first conductive feature 140, the second conductive feature 150, or the third conductive feature 160 may be formed by a process including, but not limited to, ALD, CVD, PVD, sputtering, plating, or combinations thereof.

In some embodiments, the first conductive feature 140 is a first metal line. In some embodiments, the second conductive feature 150 comprises a second metal line 152 and a conductive plug 154 connected to the second metal line 152. The second metal line 152 has a third sidewall 152a, a fourth sidewall 152b facing the third sidewall 152a, and a second bottom surface 152c connected to the conductive plug 154. In some embodiments, the conductive plug 154 is a via or a contact. The conductive plug 154 has a fifth sidewall 154a, a sixth sidewall 154b facing the fifth sidewall 154a, and a third bottom surface 154c connected to the third conductive feature 160. In some embodiments, the third conductive feature 160 is a gate electrode, a conductive contact such as a tungsten plug, a conductive poly-silicon line, a third metal line, or the like.

In some embodiments, the first dielectric feature 170a comprises a silicon compound. In some embodiments, the silicon compound comprises a silicon oxide, a silicon nitride, a silicon carbide, a silicon boride, or a combination of two or more thereof. The first dielectric feature 170a may be formed using a suitable process such as ALD, CVD, PVD, molecular beam epitaxy (MBE), spin-on, or combinations thereof. In some embodiments, the first dielectric feature 170a has a thickness in a range from about 10 angstroms (Å) to about 50 angstroms (Å). In other embodiments, the thickness is in a range from about 20 Å to about 40 Å. As depicted above, the length of the first dielectric feature 170a is at least 10 percent less than the length of the first sidewall 140a. In some embodiments, a ratio of the length of the first dielectric feature 170a divided by the length of the first sidewall 140a is from about 0.25 to about 0.6. In other embodiments, the ratio is from about 0.3 to about 0.5.

As depicted above, the second metal line 152 has a third sidewall 152a, a fourth sidewall 152b facing the third sidewall 152a, and a second bottom surface 152c connected to the conductive plug 154. In some embodiments, a third dielectric feature 170c is along an upper portion of the third sidewall 152a, and a fourth dielectric feature 170d is along an upper portion of the fourth sidewall 152b. In some embodiments, a ratio of a length of the third dielectric feature 170c divided by a length of the third sidewall 152a is from about 0.25 to about 0.6. In other embodiments, the ratio is from about 0.3 to about 0.5.

As depicted above, the conductive plug 154 has a fifth sidewall 154a, a sixth sidewall 154b facing the fifth sidewall 154a, and a third bottom surface 154c connected to the third conductive feature 160. In some embodiments, a fifth dielectric feature 170e is along an upper portion of the fifth sidewall 154a, and a sixth dielectric feature 170f is along an upper portion of the sixth sidewall 154b. In some embodiments, a ratio of a length of the fifth dielectric feature 170e divided by a length of the fifth sidewall 154a is from about 0.5 to about 0.8. In other embodiments, the ratio is from about 0.6 to about 0.7.

As depicted above, the interconnect structure 100 may further comprise an ESL 120 between the LK dielectric layer 130 and the substrate 110. The ESL 120 is extended through by the second conductive structure 150 or, more specifically, by the conductive plug 154. The material for the ESL 120 includes SiO, SiC, SiN, SiOC, SiON, SiCN, TiN, AlN, AlON, TEOS, hard black diamond (HBD), or the like. Alternatively, the ESL 120 may be formed by depositing and annealing a metal oxide material, which includes Hf, $HfO_2$, or Al. The ESL 120 may be formed using a suitable process such as ALD, CVD, PVD, MBE, spin-on, or combinations thereof. In some embodiments, the ESL 120 has a thickness in a range from about 10 Å to about 300 Å.

The interconnect structures of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

As depicted in FIG. 1, in some embodiments, the interconnect structure 100 comprises a low-k (LK) dielectric layer 130 over a substrate 110; a first conductive feature 140 having a first metal line in the LK dielectric layer 130, wherein the first metal line has a first sidewall 140a, a second sidewall 140b facing the first sidewall 140a, and a first bottom surface 140c contacting the LK dielectric layer 130; a second conductive feature 150 having a second metal line 152 and a conductive plug 154 in the LK dielectric layer 130, wherein the second metal line 152 has a third sidewall 152a, a fourth sidewall 152b facing the third sidewall 152a, and a second bottom surface 152c connected to the conductive plug 154, and wherein the conductive plug 154 has a fifth sidewall 154a, a sixth sidewall 154b facing the fifth sidewall 154a, and a third bottom surface 154c connected to a third conductive feature 160; a first dielectric feature 170a along an upper portion of the first sidewall 140a; a second dielectric feature 170b along an upper portion of the second sidewall 140b; a third dielectric feature 170c along an upper portion of the third sidewall 152a; a fourth dielectric feature 170d along an upper portion of the fourth sidewall 152b; a fifth dielectric feature 170e along an upper portion of the fifth sidewall 154a; and a sixth dielectric feature 170f along an upper portion of the sixth sidewall 154b.

Figure 2:
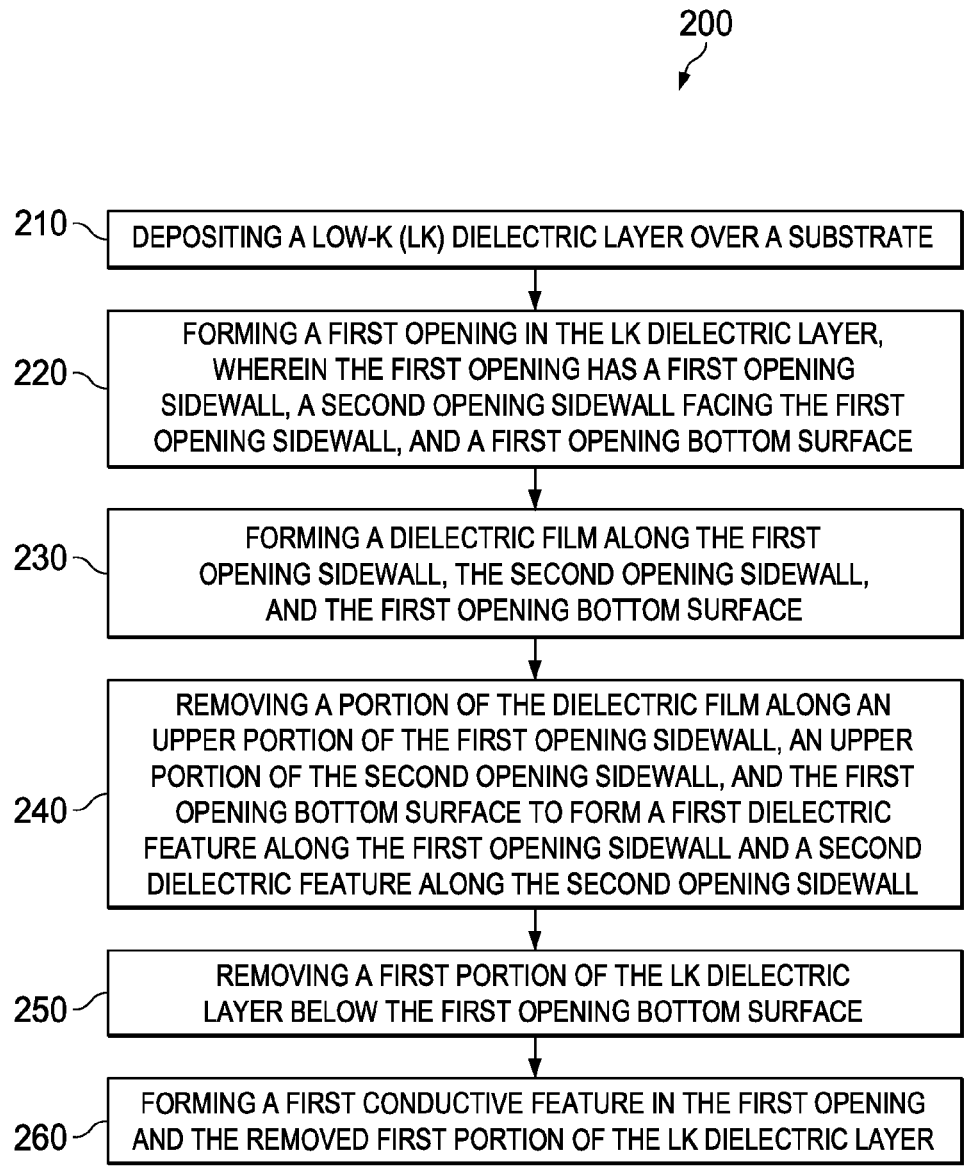
FIG. 2 is a flowchart of a method 200 of forming the interconnect structure 100 according to various aspects of the present disclosure.

FIG. 2 is a flowchart of a method 200 of forming the interconnect structure 100 according to various aspects of the present disclosure. It is understood that additional steps can be provided before, during, and after the method 200, and some of the steps described can be replaced or eliminated for other embodiments of the method 200. The method 200 begins at step 210 in which a low-k (LK) dielectric layer is deposited over a substrate. The method 200 continues with step 220 in which a first opening is formed in the LK dielectric layer, wherein the first opening has a first opening sidewall, a second opening sidewall facing the first opening sidewall, and a first opening bottom surface. The method 200 continues with step 230 in which a dielectric film is formed along the first opening sidewall, the second opening sidewall, and the first opening bottom surface. The method 200 continues with step 240 in which a portion of the dielectric film along an upper portion of the first opening sidewall, an upper portion of the second opening sidewall, and the first opening bottom surface is removed to form a first dielectric feature along the first opening sidewall and a second dielectric feature along the second opening sidewall. The method 200 continues with step 250 in which a first portion of the LK dielectric layer below the first opening bottom surface is removed. The method 200 continues with step 260 in which a first conductive feature is formed in the first opening and the removed first portion of the LK dielectric layer. The method 200 may further comprise forming a second opening in the LK dielectric layer, the second opening having a trench and a plug hole connected to the trench, wherein the trench has a first trench sidewall, a second trench sidewall facing the first trench sidewall, and a trench bottom surface, and wherein the plug hole has a first plug hole sidewall, a second plug hole sidewall facing the first plug hole sidewall, and a plug hole bottom surface. The method 200 may further comprise forming the dielectric film along the first trench sidewall, the second trench sidewall, a first portion of the trench bottom surface, a second portion of the trench bottom surface, the first plug hole sidewall, the second plug hole sidewall, and the plug hole bottom surface. The method 200 may further comprise removing a portion of the dielectric film along an upper portion of the first trench sidewall and the first portion of the trench bottom surface to form a third dielectric feature along the first trench sidewall. The method 200 may further comprise removing a portion of the dielectric film along an upper portion of the second trench sidewall and the second portion of the trench bottom surface to form a fourth dielectric feature along the second trench sidewall. The method 200 may further comprise removing a portion of the dielectric film along an upper portion of the first plug hole sidewall, an upper portion of the second plug hole sidewall, and the plug hole bottom surface to form a fifth dielectric feature along the first plug hole sidewall and a sixth dielectric feature along the second plug hole sidewall. The method 200 may further comprise removing a second portion of the LK dielectric layer below the first portion of the trench bottom surface. The method 200 may further comprise removing a third portion of the LK dielectric layer below the second portion of the trench bottom surface. The method 200 may further comprise removing a fourth portion of the LK dielectric layer below the plug hole bottom surface. The method 200 may further comprise forming a second conductive feature in the second opening and the removed second, third, fourth portions of the LK dielectric layer. An etch stop layer (ESL) may be further formed between the LK dielectric layer and the substrate. The discussion that follows illustrates embodiments of the interconnect structure 100 that can be fabricated according to the method 200 of FIG. 2.

Figure 3:
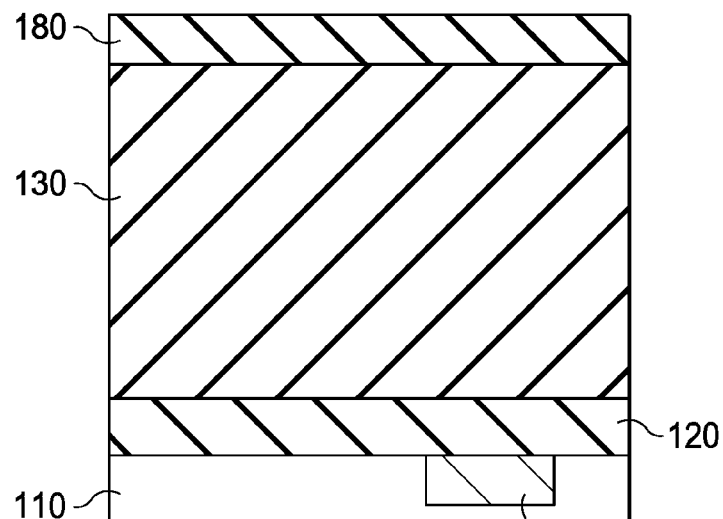
FIGS. 3-8 are cross-sectional views of the interconnect structure 100 at various stages of fabrication according to various aspects of the present disclosure.

FIGS. 3-8 are cross-sectional views of the interconnect structure 100 at various stages of fabrication according to various aspects of the present disclosure. As depicted in FIG. 3 and step 210 in FIG. 2, the method 200 begins at step 210 by depositing a low-k (LK) dielectric layer 130 over a substrate 110. In some embodiments, the substrate 110 includes a dielectric layer or a lower conductive feature 160 such as a gate electrode or a metal line. The LK dielectric layer 130 may be formed by ALD, CVD, PVD, or combinations thereof. Before depositing the LK dielectric layer 130 over the substrate 110, the method 200 may further comprise forming an etch stop layer (ESL) 120 over the substrate 110. The ESL 120 may be formed using a suitable process such as ALD, CVD, PVD, MBE, spin-on, or combinations thereof. The method 200 may further comprise forming a hard mask layer 180 over the LK dielectric layer 130. The hard mask layer 180 may be formed using an ALD, CVD, PVD process, or combinations thereof. In some embodiments, the hard mask layer 180 includes a dielectric material, such as silicon oxide, silicon nitride, silicon oxynitride, or other suitable materials. In some embodiments, the hard mask layer 180 includes a metal nitride compound, such as TiN.

As depicted in FIG. 4 and step 220 in FIG. 2, the method 200 continues with step 220 by forming a first opening 132 in the LK dielectric layer 130, wherein the first opening 132 has a first opening sidewall 132a, a second opening sidewall 132b facing the first opening sidewall 132a, and a first opening bottom surface 132c. Step 220 comprises using an etch process. For example, step 220 is performed by an anisotropic etch process (e.g., dry etching). The method 200 may further comprise forming a second opening 134 in the LK dielectric layer 130, the second opening 134 having a trench 136 and a plug hole 138 connected to the trench 136, wherein the trench 136 has a first trench sidewall 136a, a second trench sidewall 136b facing the first trench sidewall 136a, and a trench bottom surface 136c, and wherein the plug hole 138 has a first plug hole sidewall 138a, a second plug hole sidewall 138b facing the first plug hole sidewall 138a, and a plug hole bottom surface 138c.

The process steps up to this point have provided the interconnect structure 100 having the first opening 132 or the second opening 134 in the LK dielectric layer 130. Conventionally, in order to form a desired pattern, a long-time etch process may induce damage (e.g., plasma damage) in the LK dielectric layer 130, and subsequent processes may induce further damage. Thus, an additional approach to provide protection for the LK dielectric layer 130 is needed.

Figure 5:
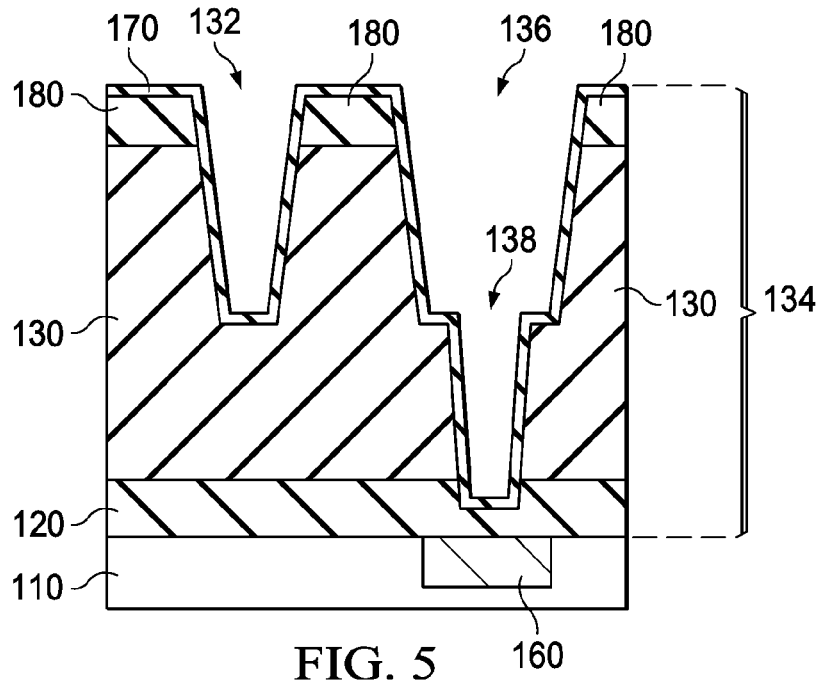

As depicted in FIG. 5 and step 230 in FIG. 2, the method 300 continues with step 230 by forming a dielectric film 170 along the first opening sidewall 132a, the second opening sidewall 132b, and the first opening bottom surface 132c. The dielectric film 170 may be formed using an ALD, CVD, PVD process, or combinations thereof. The dielectric film 170 includes a dielectric material, such as silicon oxide, silicon nitride, silicon carbide, silicon boride, or other suitable materials. In some embodiments, the dielectric film 170 has a thickness in a range from about 10 Å to about 50 Å. In other embodiments, the thickness is in a range from about 20 Å to about 40 Å. The method 200 may further comprise forming the dielectric film 170 along the first trench sidewall 136a, the second trench sidewall 136b, a first portion of the trench bottom surface 136c, a second portion of the trench bottom surface 136c, the first plug hole sidewall 138a, the second plug hole sidewall 138b, and the plug hole bottom surface 138c. The dielectric film 170 can protect the LK dielectric layer 130 from being damaged by subsequent processes such as in a plasma environment.

Figure 6:
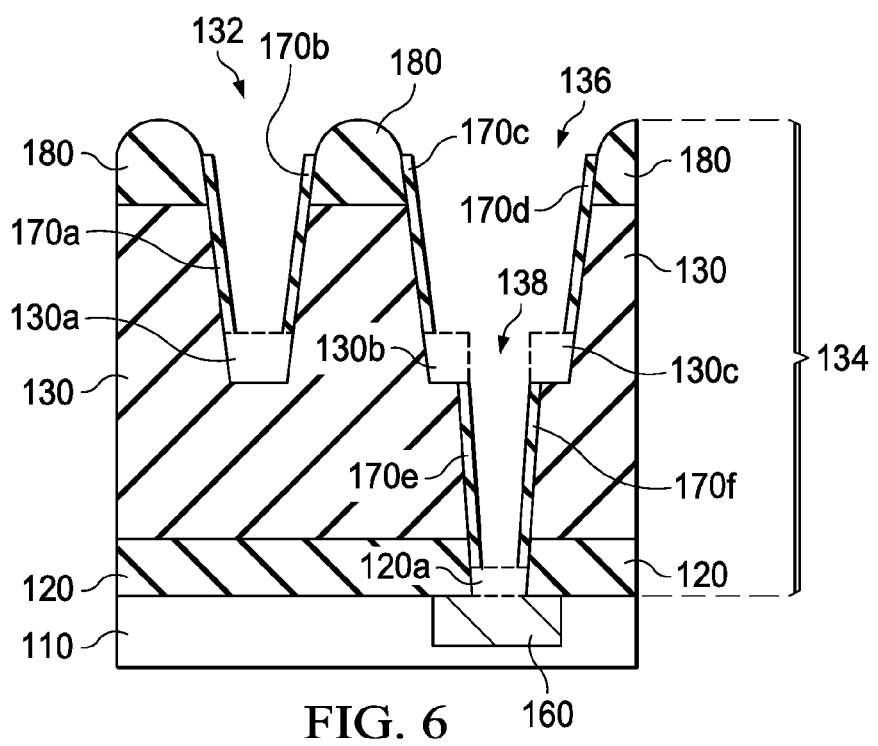

As depicted in FIG. 6 and step 240 in FIG. 2, the method 200 continues with step 240 by removing a portion of the dielectric film 170 along an upper portion of the first opening sidewall 132a, an upper portion of the second opening sidewall 132b, and the first opening bottom surface 132c to form a first dielectric feature 170a along the first opening sidewall 132a and a second dielectric feature 170b along the second opening sidewall 132b. Step 240 comprises using an etch process. Corners of the hard mask layer 180 may be rounded by the etch process. In some embodiments, step 240 is performed by an anisotropic etch process (e.g., dry etching).

As depicted in FIG. 6, the method 200 may further comprise removing a portion of the dielectric film 170 along an upper portion of the first trench sidewall 136a and the first portion of the trench bottom surface 136c to form a third dielectric feature 170c along the first trench sidewall 136a. The method 200 may further comprise removing a portion of the dielectric film 170 along an upper portion of the second trench sidewall 136b and the second portion of the trench bottom surface 136c to form a fourth dielectric feature 170d along the second trench sidewall 136b. The method 200 may further comprise removing a portion of the dielectric film 170 along an upper portion of the first plug hole sidewall 138a, an upper portion of the second plug hole sidewall 138b, and the plug hole bottom surface 138c to form a fifth dielectric feature 170e along the first plug hole sidewall 138a and a sixth dielectric feature 170f along the second plug hole sidewall 138b.

As depicted in FIG. 6 and step 250 in FIG. 2, the method 200 continues with step 250 by removing a first portion 130a of the LK dielectric layer 130 below the first opening bottom surface 132c. The method 200 may further comprise removing a second portion 130b of the LK dielectric layer 130 below the first portion of the trench bottom surface 136c. The method 200 may further comprise removing a third portion 130c of the LK dielectric layer 130 below the second portion of the trench bottom surface 136c. Note that, 130b and 130c (portions of the LK dielectric layer 130; adjoining an upper portion of the plug hole 138 and a lower portion of the trench 136) are removed during the etch process. So the etch process removes not only the dielectric film 170 from the upper portion of plug 138 but also the dielectric film 170 from the lower portion of trench 136. The method 200 may further comprise removing a portion 120a of the ESL 120 below the plug hole bottom surface 138c. In some embodiments, the step of removing the first portion 130a, the second portion 130b, the third portion 130c of the LK dielectric layer 130, or the portion 120a of the ESL 120 is performed by an anisotropic etch process (e.g., dry etching).

Figure 7:
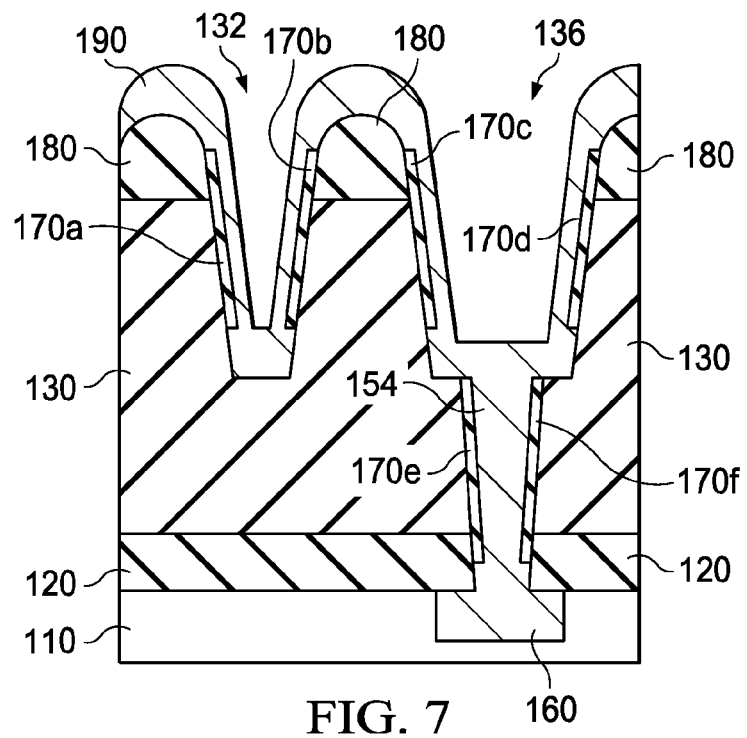

As depicted in FIG. 7, the method 200 continues to form a barrier layer (not shown) and a seed layer 190 on inner surfaces of the first opening 132 or the second opening 134. The barrier layer may be formed by ALD, CVD, PVD, sputtering, or combinations thereof. The barrier layer may be selected from a group of W, WN, Ti, Al, TiAl, TiN, TiAlN, Ta, TaC, TaN, TaCN, TaSiN, Mn, Zr, Nb, or Ru. The seed layer 190 may be formed by a process including, but not limited to, ALD, CVD, PVD, sputtering, plating, or combinations thereof. The seed layer 190 comprises Cu, Al, Ag, Au, or alloys thereof. In some embodiments, the plug hole 138 is filled with the barrier layer and the seed layer 190 to form a conductive plug 154. In some embodiments, the conductive plug 154 is connected to a lower conductive feature 160.

Figure 8:
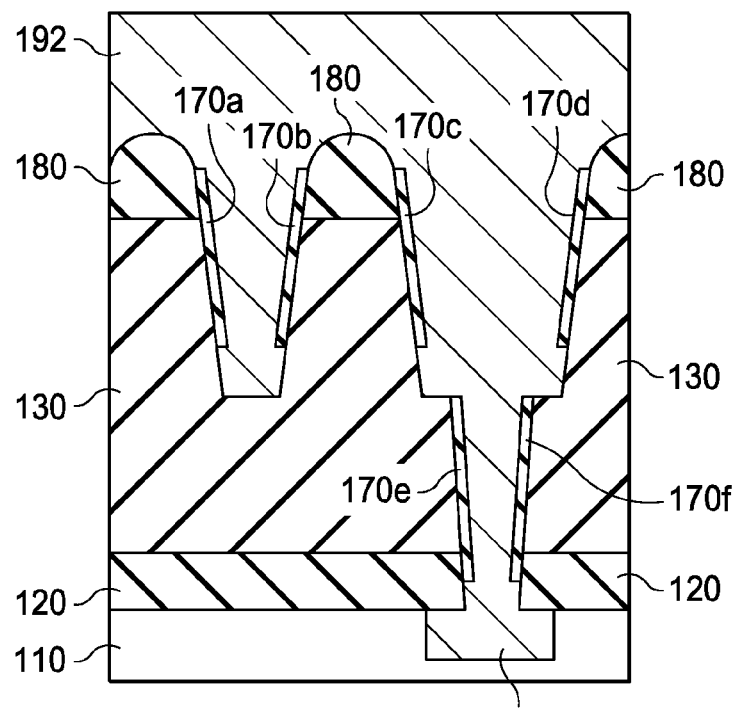

As depicted in FIG. 8, the method 200 continues to form a conductive layer 192 in the first opening 132 or the trench 136 of the second opening 134. The conductive layer 192 is over the LK dielectric layer 130 and the hard mask layer 180. The conductive layer 192 may be formed by a process including, but not limited to, ALD, CVD, PVD, sputtering, plating, or combinations thereof. The conductive layer 192 comprises Cu, Al, Ag, Au, or alloys thereof.

As depicted in FIG. 1 and step 260 in FIG. 2, the method 200 continues with step 260 by forming a first conductive feature 140 in the first opening 132 and the removed first portion 130a of the LK dielectric layer 130. Step 260 comprises: forming the conductive layer 192 in the first opening 132; and performing chemical-mechanical planarization (CMP) on at least one of the LK dielectric layer 130 or the conductive layer 192. The method 200 may further comprise forming a second conductive feature 150 in the second opening 134, the removed second 130b, third 130c portions of the LK dielectric layer 130, and the removed portion 120a of the ESL 120.

The methods of the present disclosure are not limited to be used by a planar device on the substrate and can be applied to a non-planar device as well, such as a fin-like field effect transistor (FinFET) or a nanowire device. Based on the discussions above, it can be seen that by using the methods of the present disclosure, the damage in the LK dielectric layer caused by an etch process and subsequent processes can be mitigated. As a result, the yield and reliability of the device can be well controlled by using the methods of the present disclosure.

One of the broader forms of the present disclosure involves an interconnect structure. The interconnect structure comprises a low-k (LK) dielectric layer over a substrate; a first conductive feature in the LK dielectric layer, wherein the first conductive feature has a first sidewall, a second sidewall facing the first sidewall, and a first bottom surface contacting the LK dielectric layer; a first dielectric feature along an upper portion of the first sidewall, wherein a length of the first dielectric feature is at least 10 percent less than a length of the first sidewall; and a second dielectric feature along an upper portion of the second sidewall.

Another of the broader forms of the present disclosure involves an interconnect structure. The interconnect structure comprises a low-k (LK) dielectric layer over a substrate; a first conductive feature having a first metal line in the LK dielectric layer, wherein the first metal line has a first sidewall, a second sidewall facing the first sidewall, and a first bottom surface contacting the LK dielectric layer; a second conductive feature having a second metal line and a conductive plug in the LK dielectric layer, wherein the second metal line has a third sidewall, a fourth sidewall facing the third sidewall, and a second bottom surface connected to the conductive plug, and wherein the conductive plug has a fifth sidewall, a sixth sidewall facing the fifth sidewall, and a third bottom surface connected to a third conductive feature; a first dielectric feature along an upper portion of the first sidewall; a second dielectric feature along an upper portion of the second sidewall; a third dielectric feature along an upper portion of the third sidewall; a fourth dielectric feature along an upper portion of the fourth sidewall; a fifth dielectric feature along an upper portion of the fifth sidewall; and a sixth dielectric feature along an upper portion of the sixth sidewall.

Still another of the broader forms of the present disclosure involves a method of forming an interconnect structure. The method comprises depositing a low-k (LK) dielectric layer over a substrate; forming a first opening in the LK dielectric layer, wherein the first opening has a first opening sidewall, a second opening sidewall facing the first opening sidewall, and a first opening bottom surface; forming a dielectric film along the first opening sidewall, the second opening sidewall, and the first opening bottom surface; removing a portion of the dielectric film along an upper portion of the first opening sidewall, an upper portion of the second opening sidewall, and the first opening bottom surface to form a first dielectric feature along the first opening sidewall and a second dielectric feature along the second opening sidewall; removing a first portion of the LK dielectric layer below the first opening bottom surface; and forming a first conductive feature in the first opening and the removed first portion of the LK dielectric layer.

In a general aspect, embodiments described herein may provide for an interconnect structure, the interconnect structure a dielectric layer overlying a substrate. An opening is in the dielectric layer, the opening defined by sidewalls. The sidewalls have a top portion and a bottom portion. A dielectric feature lines the top portion of the sidewalls, whereas the bottom portion of the sidewalls are free of the dielectric feature. A conductive feature fills the opening.

In another general aspect, embodiments described herein provide for a method of forming an interconnect structure that includes depositing a dielectric layer on a substrate and patterning the dielectric layer to have an opening therein, the opening defined by sidewalls and a bottom. The method further includes lining the sidewalls and bottom of the opening with a dielectric film and removing the dielectric film from the bottom of the opening. The method further includes extending the opening deeper into the dielectric layer, such that the sidewalls of the opening include a top portion lined with the dielectric film and a bottom portion not lined with the dielectric film, and filling the extended opening with a conductor.

In yet additional general aspects, embodiments described herein may provide a method of forming an interconnect structure that includes depositing a dielectric layer over a substrate and forming a hard mask layer over the dielectric layer. The method further includes patterning the hard mask and the dielectric layer to form an opening extending through the hard mask and into the dielectric layer, and conformally depositing a dielectric film extending over a top surface of the hard mask layer and lining sidewalls and a bottom of the opening. The method also includes removing the dielectric film from the bottom of the opening, thereby exposing a region of the dielectric layer underlying the opening, and etching the exposed region of the dielectric layer to extend the opening further into the dielectric layer. The dielectric film lines an upper portion of sidewalls of the extended opening and a lower portion of sidewalls of the extended opening is free of the dielectric film. The method yet further includes filling the extended opening with a conductor.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An interconnect structure, comprising:
   a dielectric layer overlying a substrate;
   an opening in the dielectric layer, the opening defined by sidewalls, the sidewalls having a top portion and a bottom portion;
   a dielectric feature lining the top portion of the sidewalls, the bottom portion of the sidewalls being free of the dielectric feature, wherein a length of the top portion of the sidewalls lined with the dielectric feature is at least ten percent less than a length of the sidewalls; and
   a conductive feature filling the opening, top surfaces of the conductive feature and the dielectric feature being substantially level;
   a second opening in the dielectric layer, the second opening being aligned with the opening in a direction extending from a top of the dielectric layer toward a bottom of the dielectric layer, the second opening defined by second sidewalls, the second sidewalls having a second top portion and a second bottom portion;
   a second dielectric feature lining the second top portion of the second sidewalls, the second bottom portion of the sidewalls being free of the second dielectric feature; and
   a second conductive feature filling the second opening, the second conductive feature being in electrical and physical contact with the conductive feature.

2. The interconnect structure of claim 1, wherein the dielectric feature lining the top portion of the sidewalls has a first length measured in a direction extending from a top of the dielectric layer toward a bottom of the dielectric layer;

the sidewalls have a second length measured in the direction; and a ratio of the first length to the second length is from about 0.25 to about 0.6.

3. The interconnect structure of claim 1, wherein the dielectric feature comprises a material selected from the group consisting of a silicon oxide, a silicon nitride, a silicon carbide, a silicon boride, and combinations thereof.

4. The interconnect structure of claim 1, wherein the conductive feature is in physical contact with the bottom portion of the sidewalls and wherein the dielectric feature is interjacent the conductive feature and the top portion of the sidewalls.

5. The interconnect structure of claim 1, wherein the conductive feature includes a barrier layer and a seed layer.

6. The interconnect structure of claim 1, wherein the second dielectric feature lining the second top portion of the second sidewalls has a third length measured in a direction extending from a top of the dielectric layer toward a bottom of the dielectric layer;

the second sidewalls have a fourth length measured in the direction; and a ratio of the third length to the fourth length is from about 0.5 to about 0.8.

7. The interconnect structure of claim 1, further comprising:

a third opening in the dielectric layer, the third opening being aligned with the opening in a direction extending parallel to a top surface of the dielectric layer;

the third opening defined by third sidewalls, the third sidewalls having a third top portion and a third bottom portion;

a third dielectric feature lining the third top portion of the third sidewalls, the third bottom portion of the sidewalls being free of the third dielectric feature; and a third conductive feature filling the third opening.

8. The interconnect structure of claim 1, further comprising:

the second conductive feature further being in physical contact with the bottom portion of the second sidewalls, wherein the second dielectric feature is interjacent the second conductive feature and the top portion of the second sidewalls;

a third opening in the dielectric layer, the third opening being aligned with the opening in a direction extending parallel to a top surface of the dielectric layer;

the third opening defined by third sidewalls, the third sidewalls having a third top portion and a third bottom portion;

a third dielectric feature lining the third top portion of the third sidewalls, the third bottom portion of the sidewalls being free of the third dielectric feature; and a third conductive feature filling the third opening, the third conductive feature being in physical contact with the bottom portion of the third sidewalls, wherein the third dielectric feature is interjacent the third conductive feature and the top portion of the third sidewalls.

9. An interconnect structure, comprising:

a dielectric layer overlying a substrate;

an opening in the dielectric layer, the opening defined by sidewalls and a bottom;

a dielectric feature lining portions of the sidewalls, the dielectric feature having a topmost end substantially level with a topmost end of the sidewalls, the dielectric feature having a bottommost end above the bottom of the opening;

a second opening in the dielectric layer, the second opening being aligned with the opening in a direction extending from a top of the dielectric layer toward a bottom of the dielectric layer, the second opening defined by second sidewalls and a second bottom; and a second dielectric feature lining the second sidewalls, the second dielectric feature having a topmost end substantially level with a topmost end of the second sidewalls and having a bottommost end above the second bottom.

10. The interconnect structure of claim 9, wherein a length of the dielectric feature, measured from the topmost end to the bottommost end is at least ten percent less than a length of the sidewalls.

11. The interconnect structure of claim 9, wherein the dielectric feature has a first length in a direction measured from the topmost end to the bottommost end, the sidewalls have a second length measured in the direction, and wherein a ratio of the first length to the second length is from about 0.25 to about 0.6.

12. The interconnect structure of claim 9, further comprising a conductor filling the opening.

13. The interconnect structure of claim 9, further compromising:

a third opening in the dielectric layer, the third defined by third sidewalls and a third bottom, the third opening extending from the second bottom of the second opening; and a third dielectric feature lining the third sidewalls, the third dielectric feature having a topmost end substantially level with a topmost end of the third sidewalls and having a bottommost end above the third bottom.

14. The interconnect structure of claim 9, wherein the dielectric feature is selected from the group consisting of silicon oxide, silicon nitride, silicon carbide, silicon boride, and combinations thereof.

15. An interconnect structure, comprising:

a substrate having a conductive element embedded therein;

an etch stop layer on the substrate, the etch stop layer having an opening therethrough exposing a portion of the conductive element;

a dielectric layer above the etch stop layer, the dielectric layer having a trench and via therein, the trench and via being vertically stacked;

a first dielectric feature lining an uppermost end of the trench, the first dielectric feature terminating at a point intermediate the uppermost end of the trench and a lowermost end of the trench; and a second dielectric feature lining an uppermost end of the via, the second dielectric feature terminating at a point intermediate the uppermost end of the via and a lowermost end of the via; and a conductive material lining the trench and the via and in electrical communication with the conductive element.

16. The interconnect structure of claim 15, wherein a length of the second dielectric feature, measured from the uppermost end to the termination is at least ten percent less than a length of the trench.

17. The interconnect structure of claim 15, wherein the second dielectric feature has a first length in a direction measured from the uppermost end to the lowermost end, the via has a second length measured in the direction, and wherein a ratio of the first length to the second length is from about 0.25 to about 0.6.

18. The interconnect structure of claim 1, wherein top surfaces of the dielectric layer and the dielectric feature are substantially level.

19. The interconnect structure of claim 12 further comprising a barrier layer and a seed layer in the opening, the barrier layer and seed layer being between the conductor and the dielectric layer.

* * * * *